Jan. 18, 1966 W. J. MEANS 3,230,297

CIRCUIT BOARD THROUGH CONNECTOR WITH SOLDER RESISTANT PORTIONS

Filed Sept. 5, 1962 2 Sheets-Sheet 1

INVENTOR
W. J. MEANS
BY John C. Morris
ATTORNEY

Jan. 18, 1966 W. J. MEANS 3,230,297

CIRCUIT BOARD THROUGH CONNECTOR WITH SOLDER RESISTANT PORTIONS

Filed Sept. 5, 1962 2 Sheets-Sheet 2

INVENTOR
W. J. MEANS
BY John C. Morris
ATTORNEY

United States Patent Office 3,230,297
Patented Jan. 18, 1966

3,230,297
CIRCUIT BOARD THROUGH CONNECTOR WITH SOLDER RESISTANT PORTIONS

Winthrop J. Means, Middletown, N.J., assignor to Bell Telephone Laboratories, Incorporated, New York, N.Y., a corporation of New York Filed Sept. 5, 1962, Ser. No. 221,577
8 Claims. (Cl. 174—68.5)

This invention relates to devices for making electrical connections within printed circuit boards and, more specifically, to devices for making electrical through-connections between the circuits on opposite sides of a printed circuit board.

In order to provide a common or electrical through-connection between the circuitry on one side of a board and that on the other, the greater part of the prior art has relied on such structures as rivets, eyelets, pins or similar rigid devices, the ends of which are soldered to their respective circuitry. The use of such a device, in essence, constitutes a solid strut between one side of the board and the other. Compliance in this type of a connection is lost with resulting inflexibility of the connection to adapt to dimensional changes encouraged by the setting operation of the connector, subsequent soldering or changes in temperature and humidity. Further complications arise if a mass soldering technique, such as dip soldering, is used in conjunction with rigid through-connections. The soldering reheats or melts the soldered joint of the through-connection resulting in an unknown stress pattern or possibly a bad connection. Bad connections are further aggravated by the difficulty with which they are detected.

The purpose of this invention is to improve the construction and operation of through-connection devices.

The accomplishment of the purpose is achieved by a through-connector having a spring construction to reduce stresses and accommodate dimensional changes.

In accordance with the preferred embodiment of the invention, the connector is formed from a continuous length of resilient electrically conducting wire. The connector is used in conjunction with a printed circuit board having circuits on both sides of the boards and holes through the board that communicate with the circuits on their respective sides. The diameter of the wire is less than one-half the diameter of the hole in the printed circuit board through which it will subsequently be inserted. Because the hole diameter is at least twice the diameter of the wire, two adjacent lengths of the wire may be placed side by side through the circuit board hole.

The connector is formed by bending a length of wire near its center to form two adjacent parallel extending portions. The extending portions are bounded on one end by at least one spring loop of continuous wire and on the other extreme by restraining means. The spring loop and the restraining means are of sufficient size so that neither may be withdrawn through the circuit board hole. The loops, containing contact segments, and the restraining means make electrical contact with the printed circuitry on opposite sides of the board.

The contact segments of the spring loop and the restraining means can be soldered, by mass soldering technique if desired, to their particular printed circuits without destroying the spring characteristics of the connection due to a selective solder receiving area on the wire. The extending portions and the adjacent part of the spring loop are treated by plating, oxidizing or chemical solutions such as the sulfides, to resist the acceptance of solder. In this way, even if mass solder techniques are employed, the extending portions are not adhered to the spring loop or the printed circuitry when the contact segments are solidly soldered to their appropriate circuitry. The connector is allowed to flex through the spring loop to accommodate any dimensional changes induced by environmental changes.

The invention will be more clearly understood from the following detailed description, when read in conjunction with the drawing, in which.

Figures 1, 2, 3, 4:
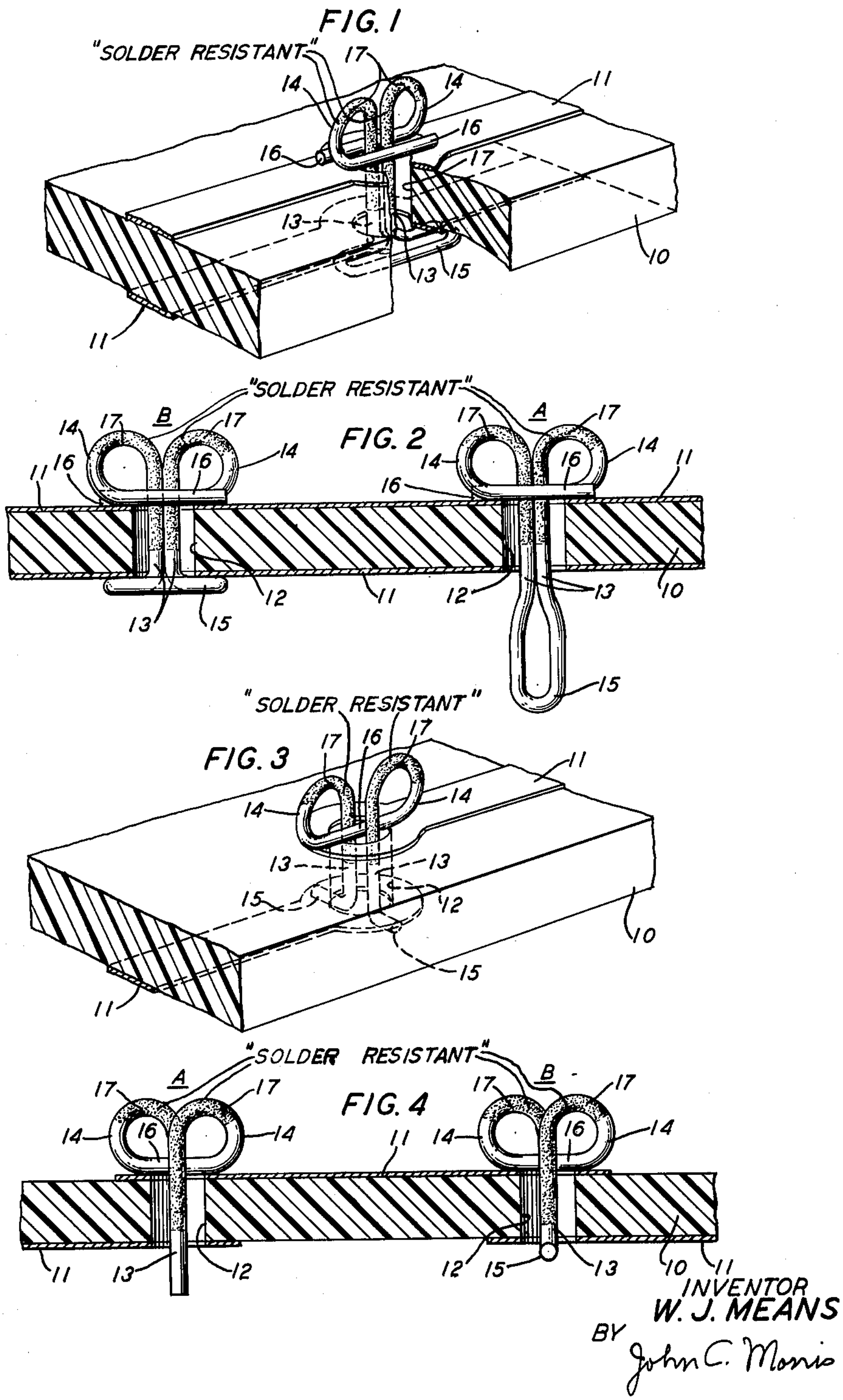
FIG. 1 is a perspective view of one embodiment of the invention.
FIG. 2 is a sectional view of the connector illustrated in FIG. 1 showing in A the inserted position and in B the installed position of the connector.
FIG. 3 is a perspective view of another embodiment of the invention.
FIG. 4 is a sectional view of the connector illustrated in FIG. 3 showing in A the inserted position and in B the installed position of the connector.

In accordance with the various figures, the invention is best used in conjunction with a printer circuit board 10 having printed circuitry 11 on both sides of the board 10. The board 10 is provided with holes 12 that communicate with the printed circuitry 11 in appropriate locations.

The connector is formed from a continuous length of resilient electrically conducting wire. The wire is bent back upon itself to form two parallel extending portions or arms 13. The arms 13 are bounded on one extreme by at least one torsional spring loop 14 and on the other by restraining means 15. The restraining means 15 are depicted in the various figures as a bent-over element in the wire. The dimensions of the spring loops 14 and the restraining means 15 are such that neither can be withdrawn through the hole 12 in the board 10.

The connector further comprises electrical connecting portions which include contact segments 16 of the spring loop 14 and the restraining means 15. The contact segments 16 and the restraining means 15 complete the electrical through-connection from the circuitry 11 on one side of the board 10 to that on the other. These electrical contacts will normally be insured by soldering (mass soldering techniques may be used, if desired) the contact segments 16 and the restraining means 15 to their specific circuits 11.

In order to guarantee the spring action of the loops 14, the wire is treated in appropriate a reas by plating, oxidizing or chemical solutions such as the sulfides to resist the acceptance of solder. The special selective areas are shown in the figures as shaded areas and are designated by the numeral 17. If the connector is formed from material that readily accepts solder, capillary action may take place soldering the arms 13 to the contact segments 16 or the circuitry 11. The spring loop 14 would then be isolated, resulting in a rigid connection similar to those previously described. However, if the connector material is treated as previously mentioned, an investigation of the figures indicates that even when dip soldered, portions of the spring loop 14 and the extending arms 13 will resist solder. The arms 13 will not adhere to the circuitry 11, the adjacent parts of the spring loop 14, or the contact segments 16, even though the contact segments 16 of the spring loop 14 will be solidly soldered to the circuitry 11. It is also pointed out that solder will not build up on the spring loop 14 nor solder the arms 13 together with the resulting loss of spring action.

The invention has been disclosed using wire as an example material for the connector. Ribbon, tape, various cross-sectional wires and other obvious electrically conducting materials may be used to good advantage within the scope of this invention. It is also contemplated to flatten or distort the cross section of the wire in the loop area to increase the compliance or resilience of the spring loop 14.

The connector is installed in the following manner. First, with reference to FIG. 2, the wire through-connector is inserted in the board hole 12 as shown in A. It is inserted with sufficient force to deflect the spring loops 14 so that the contact segments 16, which are in contact with the circuitry 11, are tending to eject the connector from the hole 12. The restraining means 15 are then upset and folded over as shown in B of FIG. 2. The upsetting procedure comprises rounding the restraining means 15 to a dimension incapable of being withdrawn from the hole 12, and accomplishing the upsetting without relieving the spring bias induced when the connector was inserted in the board 10. The through-connector is placed in the hole 12 with a permanent tensile stress created by the spring loop 14, tending to extract the connector while the restraining means 15 prevents the extraction. Changes in temperature and humidity may change the board thickness dimension, in the order of a mil or two, but such changes will be insufficient to relieve the spring tension created when the connector was inserted in the board 10. High quality electrical junctions are obtainable by the subsequent soldering of the contact segments 16 and the restraining means 15 to their individual circuits because the spring loop 14 affords adequate deflection or flexibility of the connector to prevent the occurrence of high stress levels in the soldered joint due to the heat necessitated in the soldering operation.

Figure 5:
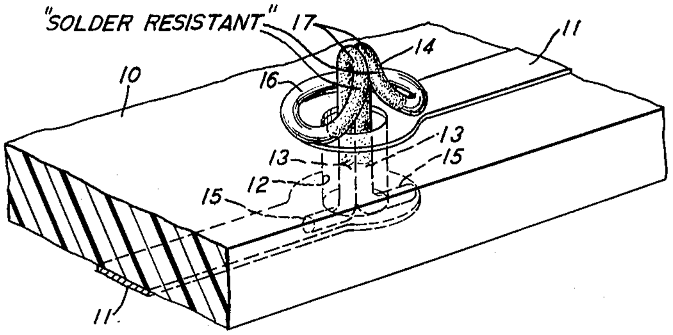
FIG. 5 is a perspective view of a still further embodiment of this invention.
Figure 6:
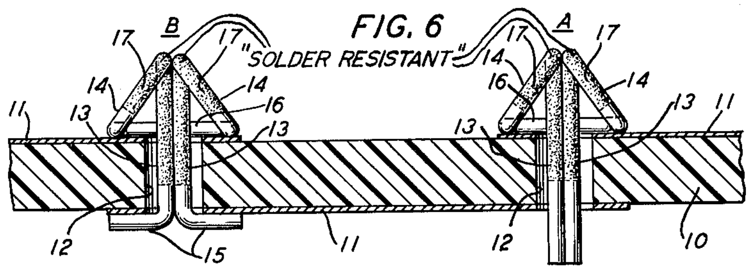
FIG. 6 is a sectional view of the connector illustrated in FIG. 5 showing in A the inserted position and in B the installed position of the connector.

The connectors shown in FIGS. 3 and 5 are inserted in a similar manner to that described above, except that no preliminary upsetting operation is required. Inspection of FIGS. 4 and 6 indicates that the connector is first inserted through the board hole 12, as shown in A, with sufficient force to bias the spring loop 14 and then the restraining means 15 are bent over, as shown in B, to prevent extraction of the device from the hole 12 and loss of the tensile stress induced in the insertion process.

Figure 7:
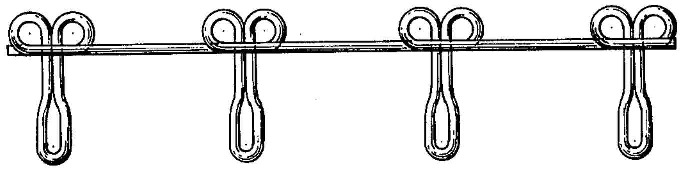
FIG. 7 is a view of a series of the connectors shown in FIG. 1 illustrating the adaptability of the invention to mass production techniques.

The connectors illustrated in this disclosure readily adapt themselves to mass production manufacturing processes. FIG. 7 illustrates a series of the connectors shown in FIG. 1, as they would appear emerging from a modern wire bending machine. The connectors can be formed in such a series from a roll of continuous material and separated, for commercial purposes, into strips of any number of terminals per strip desired. The strips containing a plurality of connectors can then be fed into an inserting machine which would install the connector in a board, as previously disclosed, and discard the length of material between two adjacent connectors in a strip.

Although three different embodiments of the invention have been shown, it is obvious to those skilled in the art that variations too numerous to mention may be made without departing from the scope of this disclosure and the appended claims.

What is claimed is:

1. Means for making a connection between conductors on opposite faces of an insulating sheet through a hole in said sheet comprising wire formed with two substantially parallel intermediate portions between at least one closed looped spring portion and restraining means, said portion being substantially circular in shape and formed from continuous wire, said portion including contact segments that are adapted to make electrical contact with a conductor on one face of the board and said restraining means including contact segments that are adapted to make electrical contact with a conductor on the opposite face of the board, a part of the looped portion and of the adjacent intermediate portions being treated to resist solder, said segments being solderable to said conductors.

2. The means recited in claim 1 wherein the looped spring portion is a torsional spring.

3. Means for making a connection between conductors on opposite faces of an insulating sheet through a hole in said sheet comprising wire formed with two substantially parallel intermediate portions between at least one looped spring portion and restraining means, said restraining means comprising a closed loop of continuous wire, the portion being adapted to bear against a conductor on one face of said sheet and the restraining means being adapted to be bent over to bear on a conductor on the opposite face of said sheet, and a part of the looped portion and of the adjacent intermediate portions being treated to resist solder.

4. In combination, a printed circuit board having an insulating sheet with conductor patterns on each of the two faces of said sheet, the latter having holes therethrough communicating with the patterns, and a connector extending through said hole making electrical connections between the patterns on opposite faces of said sheet, said connector comprising an elongated resilient material of a cross section less than one-half of the hole cross section, said material formed in extending portions, one end of said extending portions bounded by at least one closed spring loop and the other end terminating in restraining means, said loop being located exterior to said hole, said loop and said restraining means including contact segments, a portion of said loop and the adjacent extending portions being treated to resist solder, said contact segments of said restraining means bearing on the pattern on one side of the sheet, said contact segments of said loop bearing on the pattern on the opposite side of said sheet, said bearing of said contact segments of said loop generating tensile forces in said extending portions that result in contact forces between the contact segments of said spring loop and one of said patterns and contact forces between the contact segments of said restraining means and another of said patterns.

5. The combination recited in claim 4 wherein said contact segments of said loop and said restraining means are soldered to their respective conductor patterns, said portion of said loop and said adjacent extending portions that are treated to resist solder being free of solder to preserve the spring resilience of said loop.

6. The combination set forth in claim 5 wherein said restraining means comprises a closed loop of continuous wire.

7. In combination with a printed circuit board having circuit patterns on opposite sides of an insulating sheet and holes through the sheet communicating with said patterns, a connector comprising a wire having spring means on one end of an intermediate portion and restraining means on the other end, said intermediate portions contained within said hole and said spring means being exterior to said hole, said spring means and said restraining means including contact segments, said contact segments of said spring means bearing against a pattern on one side of said sheet and said contact segments of said restraining means bearing against a pattern on the other side of said sheet, the bearing of said contact segments of said spring means against said pattern causing tensile stresses in said intermediate portion and contact forces between said patterns and said contact segments of said spring means and said restraining means, said contact segments being soldered to their respective patterns with a portion of said spring means and the adjacent part of said intermediate portion being treated to resist solder to preserve the spring resilience of said spring means.

8. The combination described in claim 7 wherein said spring means comprises at least one closed loop of continuous wire forming at least one torsional spring.

References Cited by the Examiner

UNITED STATES PATENTS

| | | | |
|---|---|---|---|
| 2,473,887 | 6/1949 | Jennings | 29—490 |
| 2,893,664 | 7/1959 | Gerhauser | 29—490 X |
| 2,966,652 | 12/1960 | Parstorfer | 339—17 |
| 3,114,586 | 12/1963 | Albert | 339—17 |
| 3,155,767 | 11/1964 | Schellack | 174—68.5 |

JOHN F. BURNS, *Primary Examiner.*

JOHN P. WILDMAN, DARRELL L. CLAY, *Examiners.*